United States Patent
Nakayama et al.

(10) Patent No.: US 9,670,577 B2
(45) Date of Patent: *Jun. 6, 2017

(54) OXIDE SINTERED BODY, SPUTTERING TARGET, AND OXIDE SEMICONDUCTOR THIN FILM OBTAINED USING SPUTTERING TARGET

(71) Applicant: SUMITOMO METAL MINING CO., LTD., Tokyo (JP)

(72) Inventors: Tokuyuki Nakayama, Ome (JP); Eiichiro Nishimura, Ome (JP); Fumihiko Matsumura, Ome (JP); Masashi Iwara, Ome (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/117,529

(22) PCT Filed: Feb. 12, 2015

(86) PCT No.: PCT/JP2015/053848
§ 371 (c)(1),
(2) Date: Aug. 9, 2016

(87) PCT Pub. No.: WO2015/129468
PCT Pub. Date: Sep. 3, 2015

(65) Prior Publication Data
US 2016/0348229 A1 Dec. 1, 2016

(30) Foreign Application Priority Data

Feb. 27, 2014 (JP) .................. 2014-037022
Aug. 8, 2014 (JP) .................. 2014-163148
Dec. 25, 2014 (JP) .................. 2014-263621

(51) Int. Cl.
| | | |
|---|---|---|
| C04B 35/453 | (2006.01) | |
| H01B 1/02 | (2006.01) | |
| C23C 14/34 | (2006.01) | |
| H01L 21/02 | (2006.01) | |
| C23C 14/08 | (2006.01) | |
| C23C 14/58 | (2006.01) | |
| C04B 35/01 | (2006.01) | |
| H01L 29/786 | (2006.01) | |
| C04B 35/626 | (2006.01) | |

(52) U.S. Cl.
CPC .......... *C23C 14/3414* (2013.01); *C04B 35/01* (2013.01); *C04B 35/453* (2013.01); *C04B 35/6261* (2013.01); *C23C 14/08* (2013.01); *C23C 14/086* (2013.01); *C23C 14/5806* (2013.01); *H01L 21/02554* (2013.01); *H01L 21/02631* (2013.01); *H01L 29/78693* (2013.01); *C04B 2235/3284* (2013.01); *C04B 2235/3286* (2013.01); *C04B 2235/604* (2013.01); *C04B 2235/6562* (2013.01); *C04B 2235/6565* (2013.01); *C04B 2235/6567* (2013.01); *C04B 2235/6583* (2013.01); *C04B 2235/6585* (2013.01); *C04B 2235/6586* (2013.01); *C04B 2235/76* (2013.01); *C04B 2235/762* (2013.01); *C04B 2235/77* (2013.01); *C04B 2235/80* (2013.01); *C04B 2235/96* (2013.01); *H01L 21/02565* (2013.01)

(58) Field of Classification Search
CPC ................ C04B 35/453; H01B 1/02
USPC ................ 252/519.51, 519.1, 500
See application file for complete search history.

(56) References Cited

U.S. PATENT DOCUMENTS

| | | | |
|---|---|---|---|
| 8,598,578 B2 * | 12/2013 | Yano ................ | C01G 15/006 204/192.15 |
| 8,641,932 B2 * | 2/2014 | Yano ................ | C04B 35/453 204/192.15 |
| 8,647,537 B2 * | 2/2014 | Utsuno ................ | C04B 35/01 252/518.1 |
| 2011/0168994 A1 | 7/2011 | Kawashima | |
| 2011/0180763 A1 | 7/2011 | Utsuno | |
| 2012/0012838 A1 | 1/2012 | Hosono | |

(Continued)

FOREIGN PATENT DOCUMENTS

| | | |
|---|---|---|
| JP | 2007-73312 A1 | 3/2007 |
| JP | 2010-219538 A1 | 9/2010 |

(Continued)

OTHER PUBLICATIONS

Office Action issued to TW Application No. 104105274, mailed Feb. 24, 2016 (5 Sheets).

(Continued)

*Primary Examiner* — Douglas McGinty
(74) *Attorney, Agent, or Firm* — Kratz, Quintos & Hanson, LLP

(57) ABSTRACT

An oxide sintered body which, when made into an oxide semiconductor thin film by sputtering, can achieve low carrier density and high carrier mobility, and a sputtering target using said oxide sintered body are provided. This oxide sintered body contains indium, gallium and zinc as oxides. The gallium content is 0.20 or more and 0.49 or less in terms of Ga/(In+Ga) atomic ratio, and the zinc content is 0.0001 or more and less than 0.08 in terms of Zn/(In+Ga+Zn) atomic ratio. This amorphous oxide semiconductor thin film is formed with the oxide sintered body as a sputtering target, and can achieve a carrier density of $4.0 \times 10^{18}$ cm$^{-3}$ or less and a carrier mobility of 10 cm$^2$/V*s or greater.

10 Claims, No Drawings

(56) References Cited

U.S. PATENT DOCUMENTS

| | | | |
|---|---|---|---|
| 2012/0068130 A1* | 3/2012 | Inoue | C23C 14/086 |
| | | | 252/519.51 |
| 2013/0285053 A1 | 10/2013 | Kawashima | |
| 2014/0145124 A1 | 5/2014 | Sunagawa | |

FOREIGN PATENT DOCUMENTS

| | | |
|---|---|---|
| JP | 2011-252231 A1 | 12/2011 |
| JP | 2013-1590 A1 | 1/2013 |
| JP | 2013-100224 A1 | 5/2013 |
| JP | 2014-95144 A1 | 5/2014 |
| TW | 201402852 A | 1/2014 |
| WO | 2009/148154 A1 | 12/2009 |
| WO | 2010/032422 A1 | 3/2010 |
| WO | 2012/153491 A1 | 11/2012 |

OTHER PUBLICATIONS

Office Action issued to TW Application No. 104105273, mailed Dec. 17, 2015 (5 Sheets).
A. Takagi, et al.; "Carrier transport and electronic structure in amorphous oxide semiconductor, a In—GaZnO4;" Thin Solid Films; vol. 486; 2005; pp. 38-41 (4 Sheets).
International Search Report for International Application No. PCT/JP2015/053848 dated Apr. 28, 2015.
U.S. Appl. No. 15/117,531 by Tokuyuki Nakayama, et al., filed on Aug. 9, 2016 (38 Pages).

* cited by examiner

OXIDE SINTERED BODY, SPUTTERING TARGET, AND OXIDE SEMICONDUCTOR THIN FILM OBTAINED USING SPUTTERING TARGET

TECHNICAL FIELD

The present invention relates to an oxide sintered body, a target, and an oxide semiconductor thin film obtained by using the target, and more particularly to a sputtering target that achieves reduced carrier density of a crystalline oxide semiconductor thin film when the sputtering target contains zinc, a zinc-containing oxide sintered body most suitable for obtaining the sputtering target, and a zinc-containing amorphous oxide semiconductor thin film that is obtained by using the sputtering target and has low carrier density and high carrier mobility.

BACKGROUND ART

Thin film transistors (TFTs) are a type of field effect transistors (hereinafter referred to as FETs). TFTs are three-terminal elements having a gate terminal, a source terminal, and a drain terminal in the basic structure. TFTs are active elements having a function of switching the current between the source terminal and the drain terminal so that a semiconductor thin film deposited on a substrate is used as a channel layer in which electrons or holes move and a voltage is applied to the gate terminal to control the current flowing in the channel layer. TFTs are electronic devices that are most widely used these days in practical application. Typical applications of TFTs include liquid-crystal driving elements.

Currently, most widely used TFTs are metal-insulator-semiconductor-FETs (MIS-FETs) in which a polycrystalline silicon film or an amorphous silicon film is used as a channel layer material. MIS-FETs including silicon are opaque to visible light and thus fail to form transparent circuits. Therefore, when MIS-FETs are used as switching elements for driving liquid crystals in liquid crystal displays, the aperture ratio of a display pixel in the devices is small.

Due to the recent need for high-resolution liquid crystals, switching elements for driving liquid crystals now require high-speed driving. In order to achieve high-speed driving, a semiconductor thin film in which the mobility of carriers, electrons or holes, is higher than that in at least amorphous silicon needs to be used as a channel layer.

Under such circumstances, Patent Document 1 proposes a transparent semi-insulating amorphous oxide thin film which is a transparent amorphous oxide thin film deposited by vapor-phase film deposition method and containing elements of In, Ga, Zn, and O. The composition of the oxide is $InGaO_3(ZnO)_m$ (m is a natural number less than 6) when the oxide is crystallized. The transparent semi-insulating amorphous oxide thin film is a semi-insulating thin film having a carrier mobility (also referred to as carrier electron mobility) of more than 1 $cm^2/(V\cdot sec)$ and a carrier density (also referred to as carrier electron density) of $10^{16}/cm^3$ or less without doping with an impurity ion. Patent Document 1 also proposes a thin film transistor in which the transparent semi-insulating amorphous oxide thin film is used as a channel layer.

However, as proposed in Patent Document 1, the transparent amorphous oxide thin film (a-IGZO film) containing elements of In, Ga, Zn, and O and deposited by any method of vapor-phase film deposition selected from sputtering and pulsed laser deposition has an electron carrier mobility in the range of only about from 1 to 10 $cm^2/(V\cdot sec)$. It is pointed out that this carrier mobility is insufficient to further improve the definition of displays.

Patent Document 2 discloses a sputtering target for the purpose of forming the amorphous oxide thin film described in Patent Document 1, that is, a sintered body target containing at least In, Zn, and Ga. The sputtering target contains In, Zn, and Ga and has a relative density of 75% or more and a resistance $\rho$ of 50 $\Omega$cm or less. However, since the target disclosed in Patent Document 2 is a polycrystalline oxide sintered body having a homologous-phase crystal structure, an amorphous oxide thin film obtained by using the target has a carrier mobility of only about 10 $cm^2/V\cdot s$ as well as in Patent Document 1.

Regarding materials for achieving high carrier mobility, Patent Document 3 proposes a thin film transistor including an oxide thin film in which gallium is dissolved in indium oxide. In the oxide thin film, the Ga/(Ga+In) atomic ratio is 0.001 to 0.12, and the percentage of indium and gallium with respect to the total metal atoms is 80 at % or more. The oxide thin film has an $In_2O_3$ bixbyite structure. An oxide sintered body is proposed as the material of the oxide thin film in which gallium is dissolved in indium oxide. In the oxide sintered body, the Ga/(Ga+In) atomic ratio is 0.001 to 0.12, and the percentage of indium and gallium with respect to the total metal atoms is 80 at % or more. The oxide sintered body has an $In_2O_3$ bixbyite structure.

However, when a crystalline oxide semiconductor thin film as proposed in Patent Document 3 is applied to TFTs, a problem associated with variations in TFT characteristics due to crystal grain boundaries arises. In particular, it is significantly difficult to uniformly form a TFT on an eighth or later generation large glass substrate.

Patent Document 4 describes an oxide sintered body having a bixbyite structure and containing indium oxide, gallium oxide, and zinc oxide, and having a composition range that satisfies the formula of $In/(In+Ga+Zn)<0.75$ in terms of the atomic percentage of indium (In), gallium (Ga), and zinc (Zn). In TFT evaluation, Examples in which the mobility is as high as about 20 $cm^2/V\cdot s$ are disclosed.

However, there is problem in that microcrystals or the like tend to be generated in an oxide semiconductor thin film formed from the sintered body disclosed in Patent Document 4. In particular, it is difficult to form a TFT on a large glass substrate with a high yield. A typical process for fabricating an oxide semiconductor thin film transistor involves once forming an amorphous film and then forming an amorphous or crystalline oxide semiconductor thin film by annealing. After the amorphous film formation process, wet etching with a weak acid, such as an aqueous solution containing oxalic acid or hydrochloric acid, is performed in order to pattern the amorphous film into a channel layer having a desired shape. However, when the oxide sintered body substantially composed of a bixbyite structure disclosed in Patent Document 4 is used, the formed amorphous film has a low crystallization temperature, and there is a problem in that microcrystals are already formed at a stage after film deposition and residues are generated in an etching process, or in that partial crystallization hinders etching. That is, it is difficult to form a TFT channel layer with a desired pattern by wet etching using a photolithography technique or the like, or if a TFT is formed, problems associated with unstable operation or the like arise.

Patent Document 1: Japanese Unexamined Patent Application, Publication No. 2010-219538

Patent Document 2: Japanese Unexamined Patent Application, Publication No. 2007-073312

Patent Document 3: PCT International Publication No. WO2010/032422

Patent Document 4: PCT International Publication No. WO2009/148154

Non-Patent Document 1:
A. Takagi, K. Nomura, H. Ohta, H. Yanagi, T. Kamiya, M. Hirano, and H. Hosono, Thin Solid Films 486,38 (2005)

DISCLOSURE OF THE INVENTION

Problems to be Solved by the Invention

An object of the present invention is to provide a sputtering target that enables formation of an amorphous oxide semiconductor thin film having good wet-etching properties and high carrier mobility, an oxide sintered body most suitable for obtaining the sputtering target, and an oxide semiconductor thin film that is obtained by using the sputtering target and has low carrier density and high carrier mobility.

Means for Solving the Problems

The inventors of the present invention have newly found that an amorphous oxide semiconductor thin film which is formed by using an oxide sintered body containing indium, gallium, and zinc as oxides and in which the gallium content is 0.20 or more and 0.49 or less in terms of Ga/(In+Ga) atomic ratio and the zinc content is 0.0001 or more and less than 0.08 in terms of Zn/(In+Ga+Zn) atomic ratio has the same atomic weight ratio as the oxide sintered body and has good wet-etching properties, low carrier density, and high carrier mobility.

That is, in a first embodiment of the present invention, an oxide sintered body includes indium, gallium, and zinc as oxides. The gallium content is 0.20 or more and 0.49 or less in terms of Ga/(In+Ga) atomic ratio. The zinc content is 0.0001 or more and less than 0.08 in terms of Zn/(In+Ga+Zn) atomic ratio.

In a second embodiment of the present invention, the zinc content is 0.01 or more and 0.05 or less in terms of Zn/(In+Ga+Zn) atomic ratio in the oxide sintered body according to the first embodiment.

In a third embodiment of the present invention, the gallium content is 0.20 or more and 0.40 or less in terms of Ga/(In+Ga) atomic ratio in the oxide sintered body according to the first or second embodiment.

In a fourth embodiment of the present invention, the oxide sintered body according to any one of the first to third embodiments is substantially free of positive divalent elements other than zinc and positive trivalent to positive hexavalent elements other than indium and gallium.

In a fifth embodiment of the present invention, the oxide sintered body according to any one of the first to fourth embodiments includes an $In_2O_3$ phase having a bixbyite-type structure and a formed phase other than the $In_2O_3$ phase, the formed phase being selected from the group consisting of: a $GaInO_3$ phase having a $\beta$-$Ga_2O_3$-type structure; a $GaInO_3$ phase having a $\beta$-$Ga_2O_3$-type structure and a $(Ga, In)_2O_3$ phase; a $GaInO_3$ phase having a $\beta$-$Ga_2O_3$-type structure and an $In_2Ga_2ZnO_7$ phase having a $Yb_2Fe_3O_7$-type structure; a $(Ga, In)_2O_3$ phase and an $In_2Ga_2ZnO_7$ phase having a $Yb_2Fe_3O_7$-type structure; and a $GaInO_3$ phase having a $\beta$-$Ga_2O_3$-type structure, a $(Ga, In)_2O_3$ phase, and an $In_2Ga_2ZnO_7$ phase having a $Yb_2Fe_3O_7$-type structure.

In a sixth embodiment of the present invention, an X-ray diffraction peak intensity ratio of the $GaInO_3$ phase having a $\beta$-$Ga_2O_3$-type structure defined by formula 1 below is in the range of from 3% or more to 58% or less in the oxide sintered body according to the fifth embodiment:

$$100 \times I[GaInO_3\ phase(-111)]/\{I[In_2O_3\ phase(400)]+I[GaInO_3\ phase(-111)]\}[\%] \quad \text{Formula 1}$$

(wherein $I$ [$In_2O_3$ phase (400)] represents a (400) peak intensity of the $In_2O_3$ phase having a bixbyite-type structure, and $I$ [$GaInO_3$ phase (-111)] represents a (-111) peak intensity of the complex oxide $\beta$-$GaInO_3$ phase having a $\beta$-$Ga_2O_3$-type structure.)

In a seventh embodiment of the present invention, a sputtering target is obtained by machining the oxide sintered body according to any one of the first to sixth embodiments.

In an eighth embodiment of the present invention, an amorphous oxide semiconductor thin film is obtained by film deposition on a substrate by sputtering using the sputtering target according to the seventh embodiment, followed by heating.

In a ninth embodiment of the present invention, the amorphous oxide semiconductor thin film according to the eighth embodiment has a carrier density of less than $4.0 \times 10^{18}$ cm$^{-3}$ and a carrier mobility of 10 cm$^2$/V·s or more.

In a tenth embodiment of the present invention, the amorphous oxide semiconductor thin film according to the ninth embodiment has a carrier density of $3.0 \times 10^{18}$ cm$^{-3}$ or less.

In an eleventh embodiment of the present invention, the amorphous oxide semiconductor thin film according to the ninth embodiment has a carrier mobility of 15 cm$^2$/V·s or more.

Effects of the Invention

An oxide sintered body which contains indium, gallium, and zinc as oxides and in which the gallium content is 0.20 or more and 0.49 or less in terms of Ga/(In+Ga) atomic ratio and the zinc content is 0.0001 or more and less than 0.08 in terms of Zn/(In+Ga+Zn) atomic ratio can provide an amorphous oxide semiconductor thin film of the present invention by sputter deposition and subsequent heating when the oxide sintered body is used as a sputtering target. Since the thin film formed by the sputter deposition is free of microcrystals and the like and has sufficient amorphous properties because of the effect of predetermined amounts of gallium and zinc in the thin film, the thin film can be patterned into a desired shape by wet etching. This effect also allows the amorphous oxide semiconductor thin film according to the present invention to have low carrier density and high carrier mobility. The amorphous oxide semiconductor thin film of the present invention thus can be used as a channel layer in TFTs. Therefore, the oxide sintered body and the oxide semiconductor thin film according to the present invention obtained by using the target are industrially very useful.

PREFERRED MODE FOR CARRYING OUT THE INVENTION

An oxide sintered body used in the present invention, a sputtering target, an oxide semiconductor thin film of the present invention, and a method for producing an oxide semiconductor thin film will be described below in detail.

1. Oxide Sintered Body (a) Composition

An oxide sintered body used in the present invention contains indium, gallium, and zinc as oxides. In the oxide sintered body, the gallium content is 0.20 or more and 0.49 or less in terms of Ga/(In+Ga) atomic ratio, and the zinc content is 0.0001 or more and less than 0.08 in terms of Zn/(In+Ga+Zn) atomic ratio. When the gallium content and the zinc content in the oxide sintered body is in these ranges, the amorphous oxide semiconductor thin film according to the present invention can also have the same atomic weight ratio as the oxide sintered body.

The gallium content, in terms of Ga/(In+Ga) atomic ratio, is 0.20 or more and 0.49 or less and more preferably 0.20 or more and 0.40 or less. Gallium has an effect of increasing the crystallization temperature of the amorphous oxide semiconductor thin film of the present invention. Gallium also has an effect of reducing the oxygen loss in the amorphous oxide semiconductor thin film according to the present invention because gallium has high oxygen-bonding strength. When the gallium content is less than 0.20 in terms of Ga/(In+Ga) atomic ratio, these effects are not sufficiently obtained. When the gallium content is more than 0.49 in terms of Ga/(In+Ga) atomic ratio, the carrier mobility is not high enough as an oxide semiconductor thin film.

The oxide sintered body used in the present invention contains zinc in addition to indium and gallium in the composition ranges defined above. The zinc concentration, in terms of Zn/(In+Ga+Zn) atomic ratio, is 0.0001 or more and less than 0.08 and preferably 0.01 or more and 0.05 or less. Doping with zinc in this range reduces the carrier density of the amorphous oxide semiconductor thin film according to the present invention. This effect allows the on/off ratio of TFTs to increase when the amorphous oxide semiconductor thin film according to the present invention is used in TFTs.

It is preferred that the oxide sintered body used in the present invention be substantially free of elements M, which are positive divalent elements other than zinc and positive trivalent to positive hexavalent elements other than indium and gallium. The term "substantially free of elements M" as used herein means that the content of each element M, in terms of M/(In+Ga+M) atomic ratio, is 500 ppm or less, preferably 200 ppm or less, and more preferably 100 ppm or less. Specific examples of the element M include positive divalent elements, such as Mg, Ni, Co, Cu, Ca, Sr, and Pb; positive trivalent elements, such as Al, Y, Sc, B, and lanthanoids; positive tetravalent elements, such as Sn, Ge, Ti, Si, Zr, Hf, C, and Ce; positive pentavalent elements, such as Nb and Ta; and positive hexavalent elements, such as W and Mo.

(b) Structure of Sintered Body

The oxide sintered body used in the present invention is composed mainly of an $In_2O_3$ phase having a bixbyite-type structure and a $GaInO_3$ phase having a $\beta$-$Ga_2O_3$-type structure. The oxide sintered body may include a small amount of (Ga, In)$_2$O$_3$ phase in addition to these phases. It is preferred that gallium be dissolved in the $In_2O_3$ phase, or gallium make up the $GaInO_3$ phase and the (Ga, In)$_2$O$_3$ phase. When gallium, which is basically a trivalent cation, is dissolved in the $In_2O_3$ phase, gallium substitutes for indium, which is also a trivalent cation, at its lattice positions. When gallium makes up the $GaInO_3$ phase and the (Ga, In)$_2$O$_3$ phase, Ga basically occupies original lattice positions, but Ga may be slightly dissolved to substitute for In at the lattice positions as defects. It is not preferred that gallium be less dissolved in the $In_2O_3$ phase, or that the $GaInO_3$ phase having a $\beta$-$Ga_2O_3$-type structure and the (Ga, In)$_2$O$_3$ phase be unlikely to be formed because of unsuccessful sintering or the like, and as a result, a $Ga_2O_3$ phase having a $\beta$-$Ga_2O_3$-type structure be formed. Since the $Ga_2O_3$ phase has low conductivity, abnormal discharge arises.

The oxide sintered body of the present invention may include an $In_2Ga_2ZnO_7$ phase having a $Yb_2Fe_3O_7$-type structure. When the sintered body includes two phases of the $In_2O_3$ phase and the $In_2Ga_2ZnO_7$ phase, the sintered body is not preferred because of low carrier mobility. When the oxide sintered body includes the $In_2Ga_2ZnO_7$ phase having a $Yb_2Fe_3O_7$-type structure and further includes the $GaInO_3$ phase having a $\beta$-$Ga_2O_3$-type structure, or the (Ga, In)$_2$O$_3$ phase, or both of the $GaInO_3$ phase having a $\beta$-$Ga_2O_3$-type structure and the (Ga, In)$_2$O$_3$ phase, the oxide sintered body is preferred because of high carrier mobility.

The oxide sintered body used in the present invention is composed mainly of the $GaInO_3$ phase having a $\beta$-$Ga_2O_3$-type structure and may further include a small amount of the (Ga, In)$_2$O$_3$ phase. Crystal grains in these phases preferably have a mean particle size of 5 µm or less. Since the crystal grains in these phases are less likely to be ejected by sputtering than crystal grains in the $In_2O_3$ phase having a bixbyite-type structure, the crystal grains remaining not ejected may cause nodule generation, resulting in arcing.

The oxide sintered body used in the present invention is composed mainly of the $In_2O_3$ phase having a bixbyite-type structure and the $GaInO_3$ phase having a $\beta$-$Ga_2O_3$-type structure and may further include a small amount of the (Ga, In)$_2$O$_3$ phase. In particular, the oxide sintered body preferably includes the $GaInO_3$ phase having a $\beta$-$Ga_2O_3$-type structure so that the X-ray diffraction peak intensity ratio defined by formula 1 below is in the range of from 3% or more to 58% or less. When the X-ray diffraction peak intensity ratio is in the range of from 3% or more to 58% or less, the carrier mobility of the oxide semiconductor film is in a preferred range.

$$100 \times I[GaInO_3 \text{ phase}(-111)]/\{I[In_2O_3 \text{ phase}(400)] + I[GaInO_3 \text{ phase}(-111)]\}[\%] \quad \text{Formula 1}$$

(wherein I [$In_2O_3$ phase (400)] represents a (400) peak intensity of the $In_2O_3$ phase having a bixbyite-type structure, and I [$GaInO_3$ phase (−111)] represents a (−111) peak intensity of the complex oxide $\beta$-$GaInO_3$ phase having a $\beta$-$Ga_2O_3$-type structure.)

The oxide sintered body used in the present invention is preferably substantially free of compounds having a homologous structure. The term "homologous structure" as used herein refers to a hexagonal crystal-based layered structure represented by the composition formula of $InGaO_3$(ZnO)$_m$ (m is a natural number from 2 to 20) for an oxide containing In, Ga, and Zn. For example, $InGaZnO_4$, where m=1, has a structure in which an $InO_2$ layer and a (Ga, Zn)O layer are repeated in the c-axis direction. The presence of these layers can be determined by X-ray diffraction measurement. When the oxide sintered body is substantially free of compounds having a homologous structure in the present invention, it is advantageous in that the obtained amorphous oxide semiconductor thin film has high carrier mobility. The term "substantially free of compounds having a homologous structure" means that the weight ratio, which is obtained by, for example, Rietveld analysis, of a phase formed from homologous compounds (hereinafter may be referred to as a homologous phase) to all phases in the oxide sintered body used in the present invention is 8% or less, preferably 5% or less, more preferably 3% or less, still more preferably 1% or less, and yet still more preferably 0%.

2. Method for Producing Oxide Sintered Body

In the production of the oxide sintered body used in the present invention, an indium oxide powder, a gallium oxide powder, and a zinc oxide powder are used as raw material powders.

In the process for producing the oxide sintered body used in the present invention, these raw material powders are mixed and then compacted, and the compact is sintered by ordinary-pressure sintering. The formed phases in the structure of the oxide sintered body used in the present invention strongly depend on the conditions in each step for producing the oxide sintered body, for example, the particle size of the raw material powders, the mixing conditions, and the sintering conditions.

In the structure of the oxide sintered body used in the present invention, the each crystal grains of the $GaInO_3$ phase having a $\beta$-$Ga_2O_3$-type structure and the $(Ga, In)_2O_3$ phase are controlled to have a particle size of 5 μm or less. Because of this, the mean particle size of the raw material powders is preferably 1.5 μm or less, and more preferably 1.0 μm or less. As described above, when the gallium content is 0.08 or more in terms of Ga/(In+Ga) atomic ratio, the oxide sintered body includes, in addition to the $In_2O_3$ phase, the $GaInO_3$ phase having a $\beta$-$Ga_2O_3$-type structure or both the $GaInO_3$ phase having a $\beta$-$Ga_2O_3$-type structure and the $(Ga, In)_2O_3$ phase. In order to suppress formation of these phases as much as possible, the mean particle size of the raw material powders is preferably 1.0 μm or less.

Indium oxide powder is a raw material for ITO (tin-doped indium oxide), and fine indium oxide powder having good sintering properties has been developed along with improvements in ITO. Since indium oxide powder has been continuously used in large quantities as a raw material for ITO, raw material powder having a mean particle size of 1.0 μm or less is available these days.

Zinc oxide powder is also a main raw material for AZO (aluminum-doped zinc oxide). For the same reason as with indium oxide powder, raw material powder having a mean particle size of 1.0 μm or less is available.

However, since the amount of gallium oxide powder used is still smaller than that of indium oxide powder used, it may be difficult to obtain raw material powder having a mean particle size of 1.0 μm or less for gallium oxide powder. When only coarse gallium oxide powder is available, the powder needs to be pulverized into particles having a mean particle size of 1.0 μm or less.

In the process for sintering the oxide sintered body used in the present invention, ordinary-pressure sintering is preferably employed. Ordinary-pressure sintering is a simple and industrially advantageous method, and is also an economically preferable means.

When ordinary-pressure sintering is used, a compact is first produced as described above. Raw material powders are placed in a resin pot and mixed with a binder (for example, PVA) and the like by wet ball milling or the like. The oxide sintered body used in the present invention includes the $In_2O_3$ phase having a bixbyite-type structure and the $GaInO_3$ phase having a $\beta$-$Ga_2O_3$-type structure and may further include the $(Ga, In)_2O_3$ phase. The crystal grains in these phases are preferably controlled to have a mean particle size of 5 μm or less and are finely dispersed. It is also preferred to suppress formation of the $(Ga, In)_2O_3$ phase as much as possible. Other than this phase, it is necessary to avoid formation of the $Ga_2O_3$ phase having a $\beta$-$Ga_2O_3$-type structure, which is a cause of arcing. In order to satisfy these requirements, the ball mill mixing is preferably performed for 18 hours or longer. In this case, hard $ZrO_2$ balls are used as mixing balls. After mixing, the slurry is taken out, filtered, dried, and granulated. Subsequently, the resultant granulated material is compacted under a pressure of about 9.8 MPa (0.1 ton/cm$^2$) to 294 MPa (3 ton/cm$^2$) by cold isostatic pressing to form a compact.

The sintering process by ordinary-pressure sintering is preferably preformed in an atmosphere containing oxygen. The volume fraction of oxygen in the atmosphere is preferably over 20%. In particular, when the volume fraction of oxygen is over 20%, the oxide sintered body is further densified. An excessive amount of oxygen in the atmosphere causes the surface of the compact to undergo sintering in advance during the early stage of sintering. Subsequently, sintering proceeds while the inside of the compact is reduced, and a highly dense oxide sintered body is finally obtained.

In an atmosphere free of oxygen, the surface of the compact does not undergo sintering and as a result, densification of the sintered body does not proceed. If oxygen is free, indium oxide decomposes particularly at about 900° C. to 1000° C. to form metal indium, which makes it difficult to obtain a desired oxide sintered body.

The temperature range of ordinary-pressure sintering is preferably from 1200° C. to 1550° C., and more preferably from 1350° C. to 1450° C. in an atmosphere obtained by introducing oxygen gas into air in a sintering furnace. The sintering time is preferably 10 to 30 hours, and more preferably 15 to 25 hours.

When the sintering temperature is in the above range, and the indium oxide powder, the gallium oxide powder, and the zinc oxide powder that are controlled to have a mean particle size of 1.0 μm or less are used as raw material powders, the oxide sintered body is composed mainly of an $In_2O_3$ phase having a bixbyite-type structure. In particular, when the gallium content is 0.08 or more in terms of Ga/(In+Ga) atomic ratio, the $GaInO_3$ phase having a $\beta$-$Ga_2O_3$-type structure tends to be formed. When the zinc content is less than 0.08 in terms of Zn/(In+Ga+Zn) atomic ratio, an oxide sintered body substantially free of compounds having a homologous structure tends to be obtained.

At a sintering temperature lower than 1200° C., the sintering reaction does not proceed well. At a sintering temperature higher than 1550° C., densification is unlikely to proceed while a member of the sintering furnace reacts with the oxide sintered body. As a result, a desired oxide sintered body is not obtained. Since the gallium content of the oxide sintered body used in the present invention is 0.20 or more in terms of Ga/(In+Ga) atomic ratio, the sintering temperature is preferably 1450° C. or lower. This is because formation of the $(Ga, In)_2O_3$ phase may become significant in the temperature region of about 1500° C. A small amount of the $(Ga, In)_2O_3$ phase is acceptable, but a large amount of the $(Ga, In)_2O_3$ phase is not preferred because there are risks of reduced deposition rate and arcing.

The temperature elevation rate until the sintering temperature is reached is preferably in the range of 0.2 to 5° C./min in order to cause debinding without forming cracks in the sintered body. As long as the temperature elevation rate is this range, the temperature may be increased to the sintering temperature in a combination of different temperature elevation rates as desired. During the temperature elevation process, a particular temperature may be maintained for a certain time in order for debinding and sintering to proceed. After sintering, oxygen introduction is stopped before cooling. The temperature is preferably decreased to 1000° C. at a temperature drop rate in the range of preferably 0.2 to 5° C./min, and more preferably 0.2° C./min or more and 1° C./min or less.

3. Target

The target used in the present invention is obtained by machining the oxide sintered body used in the present invention to a predetermined size. For use as a target, the surface of the oxide sintered body is further grinded and the oxide sintered body is bonded to a backing plate to provide a target. The target preferably has a flat shape, but may have a cylindrical shape. When a cylindrical target is used, it is preferred to suppress particle generation due to target rotation. The oxide sintered body is machined into, for example, a cylindrical shape to form a tablet. The tablet can be used for film deposition by vapor deposition or ion plating.

For use as a sputtering target, the density of the oxide sintered body used in the present invention is preferably 6.3 $g/cm^3$ or more, and more preferably 6.7 $g/cm^3$ or more. When the density is less than 6.3 $g/cm^3$, nodules are generated during use in mass production. For use as a tablet for ion plating, the density of the oxide sintered body used in the present invention is preferably less than 6.3 $g/cm^3$, and more preferably 3.4 to 5.5 $g/cm^3$. In this case, the sintering temperature may be preferably less than 1200° C.

4. Oxide Semiconductor Thin Film and Method for Depositing Oxide Semiconductor Thin Film The amorphous oxide semiconductor thin film according to the present invention is mainly obtained as follows: once forming an amorphous oxide thin film on a substrate by sputtering using the sputtering target; and annealing the amorphous oxide thin film.

The sputtering target is formed from the oxide sintered body. The structure of the oxide sintered body, namely, the structure basically including an $In_2O_3$ phase having a bixbyite-type structure and a $GaInO_3$ phase having a $\beta$-$Ga_2O_3$-type structure, is important. To obtain the amorphous oxide semiconductor thin film according to the present invention, the amorphous oxide semiconductor thin film needs to have a high crystallization temperature. The crystallization temperature is related to the structure of the oxide sintered body. That is, when the oxide sintered body includes not only an $In_2O_3$ phase having a bixbyite-type structure but also a $GaInO_3$ phase having a $\beta$-$Ga_2O_3$-type structure as in the oxide sintered body used in the present invention, the oxide thin film formed from this oxide sintered body has a high crystallization temperature, specifically, a crystallization temperature of 300° C. or higher and more preferably 350° C. or higher. That is, the oxide thin film is a stable amorphous film. In contrast, when the oxide sintered body includes only an $In_2O_3$ phase having a bixbyite-type structure, the oxide thin film formed from this oxide sintered body has a crystallization temperature as low as about 200° C. to 250° C. and is an unstable amorphous oxide thin film. Therefore, annealing at 250° C. or higher or further at 300° C. or higher causes crystallization as described below. In this case, microcrystals are already generated after film deposition, and are not amorphous any more, which makes wet-etching patterning difficult. This fact is well known for ordinary ITO (tin-doped indium oxide) transparent conducting films.

Ordinary sputtering is used in the process for depositing the amorphous oxide semiconductor thin film according to the present invention. In particular, direct current (DC) sputtering is industrially advantageous because the thermal effects are minimized during film deposition and high-rate deposition can be achieved. To form the oxide semiconductor thin film according to the present invention by direct current sputtering, a gas mixture of an inert gas and oxygen, particularly a gas mixture of argon and oxygen, is preferably used as a sputtering gas. Sputtering is preferably performed in a chamber of a sputtering apparatus at an internal pressure of 0.1 to 1 Pa, particularly 0.2 to 0.8 Pa.

The substrate is typically a glass substrate and is preferably an alkali-free glass substrate. In addition, any resin sheet and resin film that withstands the above process conditions can be used. The substrate temperature in sputter deposition is preferably 600° C. or lower, and particularly preferably about room temperature or higher and 300° C. or lower.

In the process for forming the amorphous oxide thin film, presputtering can be performed as follows: for example, after evacuation to $2 \times 10^{-4}$ Pa or less, introducing a gas mixture of argon and oxygen until the gas pressure reaches 0.2 to 0.8 Pa; and generating a direct current plasma by applying direct current power so that the direct current power with respect to the area of the target, namely, the direct current power density, is in the range of about 1 to 7 $W/cm^2$. It is preferred that, after this presputtering for 5 to 30 minutes, the substrate position be corrected as desired and then sputtering be performed. In sputter deposition in the film deposition process, the direct current power applied is increased without adversely affecting the film quality in order to improve the deposition rate.

The amorphous oxide semiconductor thin film according to the present invention is obtained by depositing the amorphous oxide thin film and then annealing the amorphous oxide thin film. In an example method until annealing, an amorphous oxide thin film is once formed at a low temperature, for example, near room temperature, and annealing is then performed at a temperature lower than the crystallization temperature to obtain an amorphous oxide semiconductor thin film. In another method, the substrate is heated to a temperature lower than the crystallization temperature, preferably to between 100 and 300° C., and an amorphous oxide semiconductor thin film is deposited. Subsequently, annealing may be further performed. The heating temperature in these two methods is only about 600° C. or lower, which is the strain point of an alkali-free glass substrate or lower.

The amorphous oxide semiconductor thin film according to the present invention is obtained by once forming the amorphous oxide thin film and then annealing the amorphous oxide thin film. The annealing is performed in an oxidizing atmosphere at a temperature lower than the crystallization temperature. The oxidizing atmosphere is preferably an atmosphere containing oxygen, ozone, water vapor, nitrogen oxide, or the like. The annealing temperature is 250 to 600° C., preferably 300 to 550° C., and more preferably 350 to 500° C. The annealing time, namely, the time during which the annealing temperature is maintained, is preferably 1 to 120 minutes, and more preferably 5 to 60 minutes.

The proportion of indium, gallium, and zinc in the amorphous oxide thin film and the amorphous oxide semiconductor thin film substantially corresponds to the composition of the oxide sintered body used in the present invention. That is, the amorphous oxide semiconductor thin film contains indium and gallium as oxides and further contains zinc. The gallium content is 0.20 or more and 0.49 or less in terms of Ga/(In+Ga) atomic ratio. The zinc content is 0.0001 or more and less than 0.08, and preferably 0.05 or less in terms of Zn/(In+Ga+Zn) atomic ratio.

The amorphous oxide semiconductor thin film according to the present invention is obtained by film deposition using, as a sputtering target or the like, an oxide sintered body having the composition and structure controlled as described above, followed by annealing under the above appropriate conditions. Through this process, the carrier density decreases to less than $4.0 \times 10^{18}$ $cm^{-3}$, more preferably the carrier density decreases to $3.0 \times 10^{18}$ $cm^{-3}$ or less, particularly preferably to $2.0 \times 10^{18}$ $cm^{-3}$ or less. As described in Non-Patent Document 1, an amorphous oxide semiconductor thin film composed of indium, gallium, and zinc is in a degenerate state when the carrier density is $4.0 \times 10^{18}$ cm$^{-3}$ or more. A TFT including such an amorphous oxide semiconductor thin film as a channel layer thus does not exhibit normally-off characteristics. Therefore, the amorphous oxide semiconductor thin film according to the present invention is advantageous in that the carrier density is controlled so that the TFT exhibits normally-off characteristics. The carrier mobility is 10 cm$^2$/V·s or more, and more preferably 15 cm$^2$/V·s or more.

The amorphous oxide semiconductor thin film according to the present invention is subjected to micromachining, which is required in applications such as TFTs, by wet etching or dry etching. In general, an amorphous oxide thin film may be first formed at an appropriate substrate temperature selected from temperatures lower than the crystallization temperature, for example, temperatures from room temperature to 300° C., and then the amorphous oxide thin film may be micromachined by wet etching. Most weak acids can be used as an etchant, but a weak acid composed mainly of oxalic acid or hydrochloric acid is preferably used. For example, commercial products, such as ITO-06N available from Kanto Chemical Co., Inc., can be used. Dry etching may be selected depending on the structures of TFTs.

Although the thickness of the amorphous oxide semiconductor thin film according to the present invention is not limited, the thickness is 10 to 500 nm, preferably 20 to 300 nm, and more preferably 30 to 100 nm. When the thickness is less than 10 nm, unfavorable semiconducting properties are obtained, and as a result, high carrier mobility is not achieved. When the thickness is more than 500 nm, it is disadvantageous in that a problem associated with productivity arises.

EXAMPLES

A more detailed description is provided below by way of Examples of the present invention, but the present invention is not limited by these Examples.

<Evaluation of Oxide Sintered Body>

The proportion of metal elements in the obtained oxide sintered body was determined by ICP emission spectrometry. The formed phases were identified by a powder method with an X-ray diffractometer (available from Philips) using rejects of the obtained oxide sintered body.

<Evaluation of Basic Properties of Oxide Thin Film>

The composition of the obtained oxide thin film was determined by ICP emission spectrometry. The thickness of the oxide thin film was determined with a surface profilometer (available from KLA-Tencor Corporation). The deposition rate was calculated from the film thickness and the film deposition time. The carrier density and mobility of the oxide thin film were determined with a Hall-effect measurement apparatus (available from TOYO Corporation). The formed phases in the film were identified by X-ray diffraction measurement.

Preparation Example

An indium oxide powder, a gallium oxide powder, and a zinc oxide powder were prepared as raw material powders so that each powder has a mean particle size of 1.0 μm or less. These raw material powders were prepared so as to obtain the Ga/(In+Ga) atomic ratio and the Zn/(In+Ga+Zn) atomic ratio of Examples and Comparative Examples shown in Tables 1 and 2. The raw material powders were placed in a resin pot together with water and mixed by wet ball milling. In this case, hard ZrO$_2$ balls were used, and the mixing time was 18 hours. After mixing, the slurry was taken out, filtered, dried, and granulated. The granulated material was compacted by cold isostatic pressing under a pressure of 3 ton/cm$^2$.

Next, the compact was sintered as described below. The compact was sintered at a sintering temperature of between 1350 and 1450° C. for 20 hours in an atmosphere obtained by introducing oxygen into air in a sintering furnace at a rate of 5 L/min per 0.1 m$^3$ furnace volume. At this time, the temperature was increased by 1° C./min, oxygen introduction was stopped during cooling after sintering, and the temperature was decreased to 1000° C. by 1° C./min.

The composition of the obtained oxide sintered body was analyzed by ICP emission spectrometry. As a result, it was confirmed that the proportion of the metal elements substantially corresponds to the composition prepared at the time of mixing raw material powders in all Examples.

Next, the phases of the oxide sintered body were identified by X-ray diffraction measurement. When the oxide sintered body includes a GaInO$_3$ phase having a β-Ga$_2$O$_3$-type structure, the X-ray diffraction peak intensity ratio of the GaInO$_3$ phase having a β-Ga$_2$O$_3$-type structure defined by formula 1 below is shown in Table 1.

$$100 \times I[\text{GaInO}_3 \text{ phase}(-111)]/\{I[\text{In}_2\text{O}_3 \text{ phase}(400)] + I[\text{GaInO}_3 \text{ phase}(-111)]\}[\%] \quad \text{Formula 1}$$

(wherein I [In$_2$O$_3$ phase (400)] represents a (400) peak intensity of the In$_2$O$_3$ phase having a bixbyite-type structure, and I [GaInO$_3$ phase (-111)] represents a (-111) peak intensity of the complex oxide β-GaInO$_3$ phase having a β-Ga$_2$O$_3$-type structure.)

TABLE 1

| | Ga/(In + Ga) Atomic ratio | Zn/(In + Ga + Zn) Atomic ratio | Sintering temperature (° C.) | Density of sintered body (g/cm$^3$) | GaInO$_3$ (-111) Peak intensity ratio | Crystal structure of sintered body |
|---|---|---|---|---|---|---|
| Comparative Example 1 | 0.15 | 0.01 | 1400 | 6.92 | 9 | In$_2$O$_3$/GaInO$_3$/(Ga,In)$_2$O$_3$ |
| Comparative Example 2 | 0.20 | 0.00005 | 1450 | 6.84 | 14 | In$_2$O$_3$/GaInO$_3$ |
| Example 1 | 0.20 | 0.0001 | 1400 | 6.83 | 14 | In$_2$O$_3$/GaInO$_3$ |
| Example 2 | 0.20 | 0.01 | 1400 | 6.84 | 12 | In$_2$O$_3$/GaInO$_3$/(Ga,In)$_2$O$_3$ |
| Example 3 | 0.20 | 0.05 | 1400 | 6.85 | 14 | In$_2$O$_3$/GaInO$_3$/(Ga,In)$_2$O$_3$ |
| Example 4 | 0.20 | 0.07 | 1400 | 6.87 | 3 | In$_2$O$_3$/GaInO$_3$/In$_2$Ga$_2$ZnO$_7$ |

TABLE 1-continued

| | Ga/(In + Ga) Atomic ratio | Zn/(In + Ga + Zn) Atomic ratio | Sintering temperature (° C.) | Density of sintered body (g/cm³) | GaInO₃ (−111) Peak intensity ratio | Crystal structure of sintered body |
|---|---|---|---|---|---|---|
| Comparative Example 3 | 0.20 | 0.08 | 1350 | 6.85 | 0 | In₂O₃/In₂Ga₂ZnO₇ |
| Example 5 | 0.25 | 0.01 | 1400 | 6.74 | 12 | In₂O₃/GaInO₃/(Ga,In)₂O₃ |
| Example 6 | 0.25 | 0.05 | 1400 | 6.80 | 13 | In₂O₃/GaInO₃/(Ga,In)₂O₃ |
| Example 7 | 0.3 | 0.01 | 1400 | 6.68 | 24 | In₂O₃/GaInO₃/(Ga,In)₂O₃ |
| Example 8 | 0.4 | 0.01 | 1400 | 6.50 | 43 | In₂O₃/GaInO₃/(Ga,In)₂O₃ |
| Example 9 | 0.4 | 0.05 | 1400 | 6.47 | 45 | In₂O₃/GaInO₃/(Ga,In)₂O₃ |
| Example 10 | 0.4 | 0.07 | 1400 | 6.45 | 46 | In₂O₃/GaInO₃/(Ga,In)₂O₃ |
| Example 11 | 0.45 | 0.01 | 1400 | 6.39 | 47 | In₂O₃/GaInO₃/(Ga,In)₂O₃ |
| Comparative Example 4 | 0.45 | 0.08 | 1350 | 6.42 | 48 | In₂O₃/GaInO₃/(Ga,In)₂O₃ |
| Example 12 | 0.49 | 0.0001 | 1400 | 6.38 | 54 | In₂O₃/GaInO₃ |
| Example 13 | 0.49 | 0.01 | 1400 | 6.39 | 55 | In₂O₃/GaInO₃/(Ga,In)₂O₃ |
| Example 14 | 0.49 | 0.05 | 1400 | 6.34 | 58 | In₂O₃/GaInO₃/(Ga,In)₂O₃ |
| Example 15 | 0.49 | 0.07 | 1400 | 6.31 | 57 | In₂O₃/GaInO₃/(Ga,In)₂O₃ |
| Comparative Example 5 | 0.5 | 0.08 | 1400 | 6.28 | 62 | In₂O₃/GaInO₃/(Ga,In)₂O₃ |

The oxide sintered body was machined to a size of 152 mm in diameter and 5 mm in thickness. The sputtering surface was grinded with a cup grinding wheel so that the maximum height Rz was 3.0 µm or less. The machined oxide sintered body was bonded to an oxygen-free copper backing plate by using metal indium to provide a sputtering target.

Film deposition by direct current sputtering was performed at the substrate temperatures described in Table 2 by using the sputtering targets of Examples and Comparative Examples and an alkali-free glass substrate (Corning Eagle XG). The sputtering target was attached to a cathode of a direct current magnetron sputtering apparatus (available from Tokki Corporation) having a direct current power supply with no arcing control function. At this time, the target-substrate (holder) distance was fixed at 60 mm. After evacuation to $2 \times 10^{-4}$ Pa or less, a gas mixture of argon and oxygen was introduced at an appropriate oxygen ratio, which depends on the gallium content and zinc content in the target. The gas pressure was controlled to 0.6 Pa. A direct current plasma was generated by applying a direct current power of 300 W (1.64 W/cm²). After presputtering for 10 minutes, the substrate was placed directly above the sputtering target, namely, in the stationary opposing position, and an oxide thin film having a thickness of 50 nm was deposited. The composition of the obtained oxide thin film was confirmed to be substantially the same as that of the target.

The deposited oxide thin film was heated at between 300 and 500° C. for 30 to 60 minutes in oxygen as described in Table 2. The crystallinity of the heated oxide thin film was examined by X-ray diffraction measurement. As a result, the heated oxide thin films of Examples and Comparative Examples were all amorphous. For crystallized oxide semiconductor thin films, the crystalline phases in the oxide semiconductor thin films were identified. The Hall-effect measurement was performed on the oxide semiconductor thin films of Examples and Comparative Examples to measure the carrier density and the carrier mobility. The measured evaluation results are summarized in Table 2.

TABLE 2

| | Substrate temperature (° C.) | Heat treatment temperature (° C.) | Film thickness (nm) | Crystal structure of thin film | Carrier density (×10¹⁷ cm⁻³) | Carrier mobility (cm²/V · s) |
|---|---|---|---|---|---|---|
| Comparative Example 1 | Room temperature | 325 | 50 | Amorphous | 120 | 15.4 |
| Comparative Example 2 | Room temperature | 350 | 50 | Amorphous | 42 | 22.5 |
| Example 1 | Room temperature | 350 | 50 | Amorphous | 32 | 21.3 |
| Example 2 | Room temperature | 350 | 50 | Amorphous | 13 | 22.2 |
| Example 3 | Room temperature | 350 | 50 | Amorphous | 9.0 | 20.2 |

TABLE 2-continued

|  | Substrate temperature (° C.) | Heat treatment temperature (° C.) | Film thickness (nm) | Crystal structure of thin film | Carrier density ($\times 10^{17} cm^{-3}$) | Carrier mobility ($cm^2/V \cdot s$) |
| --- | --- | --- | --- | --- | --- | --- |
| Example 4 | Room temperature | 350 | 50 | Amorphous | 5.3 | 15.6 |
| Comparative Example 3 | Room temperature | 350 | 50 | Amorphous | 0.64 | 9.8 |
| Example 5 | Room temperature | 500 | 50 | Amorphous | 20 | 23.8 |
| Example 6 | Room temperature | 500 | 50 | Amorphous | 15 | 22.6 |
| Example 7 | Room temperature | 500 | 50 | Amorphous | 12 | 20.3 |
| Example 8 | Room temperature | 500 | 50 | Amorphous | 2.5 | 15.6 |
| Example 9 | Room temperature | 500 | 50 | Amorphous | 1.9 | 15.0 |
| Example 10 | Room temperature | 500 | 50 | Amorphous | 0.92 | 12.2 |
| Example 11 | 200 | 450 | 50 | Amorphous | 1.0 | 12.5 |
| Comparative Example 4 | 200 | 450 | 50 | Amorphous | 0.33 | 7.8 |
| Example 12 | 200 | 450 | 50 | Amorphous | 1.3 | 13.4 |
| Example 13 | 200 | 450 | 50 | Amorphous | 0.86 | 12 |
| Example 14 | 200 | 450 | 50 | Amorphous | 0.65 | 11 |
| Example 15 | 200 | 450 | 50 | Amorphous | 0.5 | 10.2 |
| Comparative Example 5 | 200 | 450 | 50 | Amorphous | 0.29 | 7.5 |

[Evaluation]

The results in Table 1 indicate that, when the gallium content is 0.20 or more and 0.49 or less in terms of Ga/(In+Ga) atomic ratio and the zinc content is 0.0001 or more and less than 0.08 in terms of Zn/(In+Ga+Zn) atomic ratio in Examples 1 to 15, the oxide semiconductor thin films included: an $In_2O_3$ phase having a bixbyite-type structure and a $GaInO_3$ phase having a $\beta$-$Ga_2O_3$-type structure; an $In_2O_3$ phase having a bixbyite-type structure, a $GaInO_3$ phase having a $\beta$-$Ga_2O_3$-type structure, and a $(Ga, In)_2O_3$ phase; or an $In_2O_3$ phase having a bixbyite-type structure, a $GaInO_3$ phase having a $\beta$-$Ga_2O_3$-type structure, and an $In_2Ga_2ZnO_7$ phase having a $Yb_2Fe_3O_7$-type structure.

The results of Table 2 also indicate that, the amorphous oxide semiconductor thin films are composed of indium, gallium, and zinc. The properties of the oxide semiconductor thin films are controlled so that the gallium content is 0.20 or more and 0.49 or less in terms of Ga/(In+Ga) atomic ratio and the zinc content is 0.0001 or more and less than 0.08 in terms of Zn/(In+Ga+Zn) atomic ratio in Examples 1 to 15.

The oxide semiconductor thin films of Examples are all found to be amorphous. The oxide semiconductor thin films of Examples have a carrier density of less than $4.0 \times 10^{18}$ $cm^{-3}$ and a carrier mobility of 10 $cm^2/V \cdot s$ or more. In particular, the oxide semiconductor thin films of Examples 2, 3, and 5 to 9 in which the gallium content is 0.20 or more and 0.40 or less in terms of Ga/(In+Ga) atomic ratio and the zinc content is 0.01 or more and 0.05 or less in terms of Zn/(In+Ga+Zn) atomic ratio are found to have good properties, specifically, a carrier density of $3.0 \times 10^{18}$ $cm^{-3}$ or less and a carrier mobility of 15 $cm^2/V \cdot s$ or more.

In Comparative Example 1, the zinc content expressed as the Zn/(In+Ga+Zn) atomic ratio is in the range of the present invention, and the gallium content expressed as the Ga/(In+Ga) atomic ratio is below 0.20, which is the lower limit of the present invention. In Comparative Example 2, the gallium content is in the range of the present invention, and the zinc content is below 0.0001, which is the lower limit of the present invention. As a result, the carrier density is found to be $4.0 \times 10^{18}$ $cm^{-3}$ or more in Comparative Examples 1 and 2. In the oxide semiconductor thin films of Comparative Examples 3 to 5, the zinc content is 0.08, which is an excessive amount, and thus the carrier mobility is found to be less than 10 $cm^2/V \cdot s$.

The invention claimed is:

1. An oxide sintered body comprising indium, gallium, and zinc as oxides, wherein
    a gallium content is 0.20 or more and 0.49 or less in terms of Ga/(In+Ga) atomic ratio, and
    a zinc content is 0.0001 or more and less than 0.08 in terms of Zn/(In+Ga+Zn) atomic ratio,
    wherein the oxide sintered body comprises an $In_2O_3$ phase having a bixbyite-type structure and a formed phase other than the $In_2O_3$ phase, the formed phase being selected from the group consisting of: a $GaInO_3$ phase having a $\beta$-$Ga_2O_3$-type structure; a $GaInO_3$ phase having a $\beta$-$Ga_2O_3$-type structure and a $(Ga, In)_2O_3$ phase; a $GaInO_3$ phase having a $\beta$-$Ga_2O_3$-type structure and an $In_2Ga_2ZnO_7$ phase having an $Yb_2Fe_3O_7$-type structure; a $(Ga, In)_2O_3$ phase and an $In_2Ga_2ZnO_7$ phase having an $Yb_2Fe_3O_7$-type structure; and a $GaInO_3$ phase having a $\beta$-$Ga_2O_3$-type structure, a $(Ga, In)_2O_3$ phase, and an $In_2Ga_2ZnO_7$ phase having an $Yb_2Fe_3O_7$-type structure.

2. The oxide sintered body according to claim 1, wherein the zinc content is 0.01 or more and 0.05 or less in terms of Zn/(In+Ga+Zn) atomic ratio.

3. The oxide sintered body according to claim 1, wherein the gallium content is 0.20 or more and 0.40 or less in terms of Ga/(In+Ga) atomic ratio.

4. The oxide sintered body according to claim 1, wherein the oxide sintered body is substantially free of positive divalent elements other than zinc and positive trivalent to positive hexavalent elements other than indium and gallium.

5. The oxide sintered body according to claim 1, wherein an X-ray diffraction peak intensity ratio of the $GaInO_3$ phase having a $\beta$-$Ga_2O_3$-type structure defined by formula 1 below is in the range of 3% or more and 58% or less:

$$100 \times I[GaInO_3 \text{ phase}(-111)]/\{I[In_2O_3 \text{ phase}(400)]+I[GaInO_3 \text{ phase}(-111)]\}[\%] \quad \text{Formula 1}$$

(wherein I [$In_2O_3$ phase (400)] represents a (400) peak intensity of the $In_2O_3$ phase having a bixbyite-type structure, and I [$GaInO_3$ phase (−111)] represents a (−111) peak intensity of the complex oxide $\beta$-$GaInO_3$ phase having a $\beta$-$Ga_2O_3$-type structure).

6. A sputtering target obtained by machining the oxide sintered body according to claim 1.

7. An amorphous oxide semiconductor thin film obtained by film deposition on a substrate by sputtering using the sputtering target according to claim 6, followed by heating.

8. The oxide semiconductor thin film according to claim 7, wherein the oxide semiconductor thin film has a carrier density of less than $4.0 \times 10^{18}$ cm$^{-3}$ and a carrier mobility of 10 cm$^2$/V·s or more.

9. The oxide semiconductor thin film according to claim 8, wherein the oxide semiconductor thin film has a carrier density of $3.0 \times 10^{18}$ cm$^{-3}$ or less.

10. The oxide semiconductor thin film according to claim 8, wherein the oxide semiconductor thin film has a carrier mobility of 15 cm$^2$/V·s or more.

\* \* \* \* \*